United States Patent [19]

Jackson et al.

[11] Patent Number: 4,589,937

[45] Date of Patent: May 20, 1986

[54] CARBIDE REINFORCED NICKEL-BASE SUPERALLOY EUTECTICS HAVING IMPROVED RESISTANCE TO SURFACE CARBIDE FORMATION

[75] Inventors: Melvin R. Jackson, Schenectady; Michael F. X. Gigliotti, Jr., Scotia; Swe-Wong Yang, Clifton Park, all of N.Y.

[73] Assignee: General Electric Company, Schenectady, N.Y.

[21] Appl. No.: 421,634

[22] Filed: Sep. 22, 1982

[51] Int. Cl.[4] .............................................. C22C 19/03
[52] U.S. Cl. .................................. 148/404; 148/409; 148/410
[58] Field of Search ........ 148/404, 409, 410, 426–429; 420/448, 441, 442, 445, 447, 451, 460

[56] References Cited

U.S. PATENT DOCUMENTS 4,292,076   9/1981   Gigliotti et al. ..................... 420/448

Primary Examiner—R. Dean
Attorney, Agent, or Firm—Paul E. Rochford; James C. Davis, Jr.; Paul R. Webb, II

[57] ABSTRACT

Monocarbide reinforced nickel-base eutectic superalloys which are particularly characterized by improved resistance to the formation of surface nucleated carbides and are, therefore, especially suited for making unidirectionally solidified anisotropic metallic bodies in the form of vanes and rotating blades for aircraft gas turbine engines are provided.

4 Claims, 8 Drawing Figures

CARBIDE REINFORCED NICKEL-BASE SUPERALLOY EUTECTICS HAVING IMPROVED RESISTANCE TO SURFACE CARBIDE FORMATION

CROSS-REFERENCE TO RELATED APPLICATION

The invention herein is related to the invention disclosed and claimed in U.S. patent application Ser. No. 481,617 which was filed on Apr. 4, 1983, is assigned to the same assignee as the instant invention and is herein incorporated by reference.

BACKGROUND OF THE INVENTION

This invention pertains generally to nickel-base superalloys which are capable of being unidirectionally solidified to form articles of manufacture having a composite microstructure of an aligned fibrous monocarbide eutectic reinforcing phase embedded in a nickel-base superalloy matrix and, more particularly, to monocarbide reinforced nickel-base superalloy eutectics characterized by improved resistance to the formation of surface nucleated carbides during unidirectional solidification.

Monocarbide reinforced nickel-base superalloy eutectics of the predominantly TaC reinforced type described, for example, in U.S. Pat. Nos. 3,904,402, 4,284,430 and 4,292,076 to Smashey, Henry and Gigliotti, Jr. et al., respectively, which are herein incorporated by reference, are primarily designed for use as unidirectionally solidified anisotropic metallic bodies in the form of vanes and rotating blades in aircraft gas turbine engines which present an environment requiring cyclic oxidation resistance, hot corrosion resistance, and high strength at high temperatures.

A major problem with the use of monocarbide reinforced eutectic superalloys, such as the alloys of U.S. Pat. Nos. 4,284,430 and 4,292,076, particularly as hollow air cooled airfoil castings, is the presence of blocky, surface nucleated carbides. In such superalloys, those carbides form an essentially continuous film on all cast surfaces, and extend to a depth typically of about 6 mils (150μ) into the casting. Nucleation of such carbides on mold or core walls occurs in the liquid ahead of the advancing solidification growth front during unidirectional solidification. Surface carbide dimensions depend on the temperature gradient in the liquid and the growth (solidification) rates, since those carbides continue to grow until the advancing front consumes all the liquid available to the carbide. Those surface nucleated carbides are undesirable in that they reduce strength, i.e., in some thin-wall hollow airfoil sections those carbides can reduce load-bearing area by 40%. Furthermore, those carbides can act as crack nucleation sites, thus detrimentally affecting fatigue life and resistance to failure by stress-rupture. Normally, such surface carbides must be removed by expensive mechanical machining processes in order to render the castings suitable for end use in aircraft gas turbine engines.

While the alloys of U.S. Pat. Nos. 4,284,430 and 4,292,076 are prone to the routine formation of large amounts of surface nucleated carbides, others, such as the alloys of U.S. Pat. No. 3,904,402, are not. There are a great many differences in composition among those alloys. The elements whose amounts vary greatly among those alloys are Ta, V, Mo, W and Cr. For example, the alloys of U.S. Pat. Nos. 4,284,430 and 4,292,076 contain Mo, large amounts of Ta and no V while the alloys of U.S. Pat. No. 3,904,402 contain V, lesser amounts of Ta and no Mo. Additionally, it is known that TiC and CbC reinforced eutectic alloys are also prone to the formation of large amounts of surface nucleated carbides.

Thus, although the eutectic superalloys described above represent significant advances in the metallurgical arts, there is a need for further improvements; specifically, eutectic superalloys having improved resistance to the formation of surface nucleated carbides, but which also have sufficient transverse ductility, cyclic oxidation resistance, hot corrosion resistance and high temperature strength properties to render them acceptable for use in aggressive environments, especially those found in aircraft gas turbine engines.

SUMMARY OF THE INVENTION

There are provided by the invention herein described monocarbide reinforced eutectic superalloys which are particularly characterized as having improved resistance to the formation of surface nucleated carbides. These novel superalloys are capable of developing in a unidirectionally solidified anisotropic article of manufacture a microstructure comprising a nickel-base superalloy matrix with an aligned fibrous monocarbide eutectic reinforcing phase embedded in the matrix. The principal articles contemplated are vanes and rotating blades for use in aircraft gas turbine engines. The novel superalloys of this invention have the properties, e.g., resistance to cyclic oxidation and hot corrosion and strength at high temperatures, required of such articles operating in aggressive environments such as those found in aircraft gas turbine engines.

Broadly, the superalloys of the invention consist essentially of vanadium and carbon; one or more elements selected from the group consisting of chromium, aluminum, cobalt, tungsten, molybdenum, hafnium, and zirconium; boron in an amount greater than an impurity amount up to 0.02%; and at least one element from the group consisting of tantalum and columbium such that, by weight, $$V/(Ta + 1.95Cb) \geq \text{about } 0.23,$$

the balance being essentially nickel and incidental impurities.

Similarly, but less broadly and more specifically, the invention provides unidirectionally solidified anisotropic composite articles of manufacture which are essentially free of surface nucleated carbides which comprise a nickel-base superalloy matrix and an aligned fibrous monocarbide eutectic reinforcing phase embedded in said matrix, and which consist essentially of, by weight, 0–20% cobalt, 0–20% chromium, 0–10% molybdenum, 0–20% tungsten, 0–9% rhenium, 0–10% aluminum, 0.7–7% vanadium, 0–15% tantalum, 0.1–1% carbon, 0 to less than 0.8% titanium, 0–4% columbium, 0–3% hafnium, 0–1.5% zirconium, boron in an amount greater than an impurity amount to 0.02%, the balance being essentially nickel and incidental impurities, subject to the proviso that, by weight, $$V/(Ta + 1.95Cb) \geq \text{about } 0.23,$$

wherein either tantalum or columbium, but not both, may be essentially zero.

DETAILED DESCRIPTION OF THE INVENTION

The series of alloys listed in Table I was prepared and directionally solidified (DS) at ¼ inch/hour (0.63 cm/hr) as ⅞ inch (2.22 cm) diameter bars.

Figure 1:
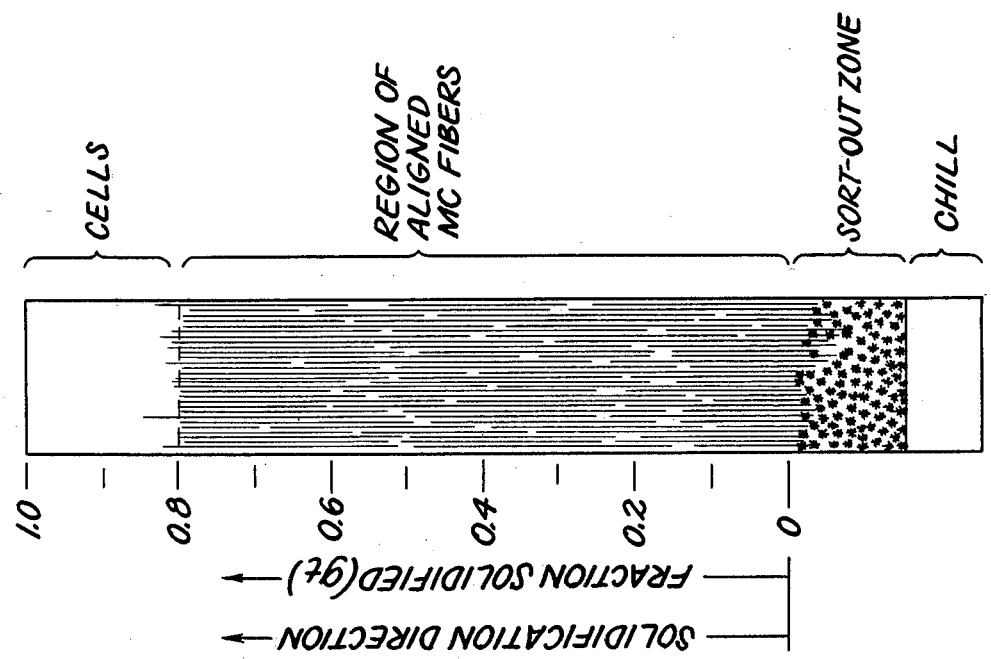
FIG. 1 is a schematic lengthwise cross-section of a unidirectionally solidified ingot of a monocarbide reinforced superalloy eutectic illustrating the terminology commonly used with respect to such ingots.

The carbon level of the Table I alloys was adjusted to minimize sort-out zone length. FIG. 1 details the terminology used herein, e.g., sort-out zone length, vis-a-vis the DS ingots.

A longitudinal stripe was polished on the as directionally solidified ingots to note microstructural features and alignment. Qualitative observations of the presence of surface carbides were made by metallographic investigation of the longitudinal stripes on the ingots of the Table I alloys.

Longitudinal rupture bars and oxidation pins were machined from a section of the as directionally solidified ⅞ inch (2.22 cm) diameter ingots. The center of the gage length region of the longitudinal rupture specimens corresponded to a fraction solidified ($g_t$) value of from 0.4 to 0.5.

Generally, the ingots made from the Table I alloys had an aligned fibrous microstructure typical of monocarbide reinforced nickel-base superalloy eutectics. In the Mo-V series (alloys 4079–4086), a definite reduction in carbide number and depth was observed with decreasing Mo and increasing V, but even the 0 a/o (atom percent) Mo alloy exhibited surface carbides. The results of the Ta-V series (alloys 4142–4154), however, indicated that the effect of Mo might be insignificant and that a more important factor was the atom ratio of V/Ta and/or the total V content. For that series of alloys, a V/Ta atom ratio of 4 effectively eliminated surface carbide formation. For the 4183–4186 series, a V/Ta atom ratio of 3.1 effectively eliminated surface carbide formation and that was so for V contents as high as 4.5 a/o or as low as 2.7 a/o.

Longitudinal rupture tests were performed at 1652° F./70 ksi (900° C./483 MPa) and at 2012° F./22.5 ksi (1100° C./155 MPa) on all of the Table I alloys except for alloy 4150 which was mismachined. The rupture tests were conducted in an argon atmosphere and the results are presented in Table II. For comparison, the value of the Larson-Miller parameter for the alloys of U.S. Pat. No. 4,292,076 is typically on the order of about 45.9 at 70 ksi and 55.3 at 22.5 ksi.

With more than 2 a/o V present, all but one alloy matched or exceeded the 70 ksi performance of the '076 type alloys. This was so even though these alloys contained 0.5 a/o [approximately 1.5 w/o (weight percent)] less Re than the '076 type alloys. Rupture lives at 22.5 ksi are much less than for the '076 type alloys indicating the effect of Re. For increasing V/Ta atom ratios and V+Ta content (alloys 4142–4154), there is a monotonic increase in 70 ksi rupture life, but an apparent peak in 22.5 ksi rupture life. For alloys 4183–4186 and 4187–4190 there is no clear trend in 70 ksi rupture life

TABLE I

COMPOSITIONS OF INITIAL SURVEY ALLOYS[1,2]
(atom percents)

| Alloy | Co | Cr | Mo | W | Re | Al | V | Ta | Ti | Cb | C | B | V/Ta | V + Ta |
|---|---|---|---|---|---|---|---|---|---|---|---|---|---|---|
| 4079 | 3.00 | 6.00 | 0.00 | 1.00 | 1.80 | 12.70 | 5.00 | 2.30 | 0.00 | 0.00 | 1.30 | 0.11 | 2.17 | 7.30 |
| 4083 | 3.00 | 6.00 | 0.70 | 1.00 | 1.80 | 12.70 | 3.30 | 2.30 | 0.00 | 0.00 | 1.30 | 0.11 | 1.43 | 5.60 |
| 4085 | 3.00 | 6.00 | 1.30 | 1.00 | 1.80 | 12.70 | 1.70 | 2.30 | 0.00 | 0.00 | 1.30 | 0.11 | 0.74 | 4.00 |
| 4086 | 3.00 | 6.00 | 2.00 | 1.00 | 1.80 | 12.70 | 0.00 | 2.30 | 0.00 | 0.00 | 1.30 | 0.11 | 0.00 | 2.30 |
| 4142 | 3.00 | 6.00 | 0.00 | 1.00 | 1.80 | 12.70 | 0.00 | 3.00 | 0.00 | 0.00 | 1.50 | 0.11 | 0.00 | 3.00 |
| 4144 | 3.00 | 6.00 | 0.00 | 1.00 | 1.80 | 12.70 | 3.00 | 1.50 | 0.00 | 0.00 | 1.50 | 0.11 | 1.00 | 4.00 |
| 4147 | 3.00 | 6.00 | 0.00 | 1.00 | 1.80 | | | | | | | | | |
| 1270 | 3.00 | 1.50 | 0.00 | 0.00 | 1.50 | 0.11 | 2.00 | 4.50 | | | | | | |
| 4150 | 3.00 | 6.00 | 0.00 | 1.00 | 1.80 | 12.70 | 4.00 | 1.00 | 0.00 | 0.00 | 1.50 | 0.11 | 4.00 | 5.00 |
| 4154 | 3.00 | 6.00 | 0.00 | 1.00 | 1.80 | 12.70 | 6.00 | 0.00 | 0.00 | 0.00 | 1.50 | 0.11 | 0.00 | 6.00 |
| 4183 | 3.00 | 6.00 | 0.00 | 1.00 | 1.80 | 13.00 | 3.56 | 1.13 | 0.00 | 0.00 | 1.80 | 0.11 | 3.15 | 4.69 |
| 4184 | 3.00 | 6.00 | 0.00 | 1.00 | 1.80 | 13.00 | 2.67 | 0.85 | 0.00 | 0.00 | 1.80 | 0.11 | 3.14 | 3.52 |
| 4186 | 3.00 | 6.00 | 0.00 | 1.00 | 1.80 | 13.00 | 4.46 | 1.41 | 0.00 | 0.00 | 1.80 | 0.11 | 3.16 | 5.87 |
| 4187 | 3.00 | 6.00 | 0.00 | 1.00 | 1.80 | 13.00 | 5.24 | 0.83 | 0.00 | 0.00 | 1.80 | 0.11 | 6.31 | 6.07 |
| 4188 | 3.00 | 6.00 | 0.00 | 1.00 | 1.80 | 13.00 | 6.95 | 1.10 | 0.00 | 0.00 | 1.80 | 0.11 | 6.32 | 8.05 |
| 4190 | 3.00 | 6.00 | 0.00 | 1.00 | 1.80 | 13.00 | 3.51 | 0.56 | 0.00 | 0.00 | 1.80 | 0.11 | 6.27 | 4.07 |
| 4250 | 3.00 | 6.00 | 0.00 | 1.00 | 1.80 | 13.00 | 3.00 | 0.00 | 1.50 | 0.00 | 1.80 | 0.11 | 2.00 (V/Ti) | 4.50 (V + Ti) |
| 4253 | 3.00 | 6.00 | 0.00 | 1.00 | 1.80 | 13.00 | 3.00 | 0.00 | 0.00 | 1.50 | 1.80 | 0.11 | 2.00 (V/Cb) | 4.50 (V + Cb) |

[1] Balance nickel plus incidental impurities
[2] Melting specification with increasing V+Ta, while there is a noted increase in 22.5 ksi rupture life with increasing V+Ta content. The Ta+V alloys (4147) is weaker than its Ti+V (4250) and Cb+V (4253) counterparts at 70 ksi, but stronger at 22.5 ksi.

Except for the Mo-V series (alloys 4079–4086) all the alloys of Table I were subjected to a cyclic oxidation exposure in which each cycle consisted of 50 minutes in a static air furnace at 2012 F. (1100 C.) and removal from the furnace for 10 minutes in still room temperature air.

TABLE II

LONGITUDINAL STRESS RUPTURE STRENGTHS OF THE TABLE I ALLOYS

| Alloy | 1652F/70 ksi/Argon | | 2012F/22.5 ksi/Argon | |
|---|---|---|---|---|
| | Life[1] | Parameter[2] | Life[1] | Parameters[2] |
| 4079 | 63.9 | 46.1 | 147.3 | 54.8 |
| 4083 | 63.2 | 46.0 | 109.9 | 54.5 |
| 4085 | 33.4 | 45.5 | 154.4 | 54.9 |
| 4086 | 9.6 | 44.3 | 110.1 | 54.5 |
| 4142 | 4.5 | 43.6 | 6.8 | 51.5 |
| 4144 | 17.4 | 44.9 | 125.7 | 54.6 |
| 4147 | 28.7 | 45.3 | 55.3 | 53.8 |
| 4154 | 166.1 | 46.9 | 26.0 | 52.9 |
| 4183 | 123.5 | 46.7 | 27.1 | 53.0 |
| 4185 | 369.3 | 47.7 | 20.4 | 52.7 |
| 4186 | 172.8 | 47.0 | 47.3 | 53.6 |
| 4187 | 100.7 | 46.5 | 25.2 | 52.9 |
| 4188 | 85.3 | 46.3 | 26.4 | 53.0 |
| 4190 | 78.6 | 46.2 | 14.2 | 52.3 |
| 4250 | 65.7 | 46.1 | 22.7 | 52.8 |
| 4253 | 142.0 | 46.8 | 46.8 | 53.6 |

[1]hours (h)
[2]Parameter = Temperature (°R) × [20 + log time (h)]/1000

Cyclic oxidation tests, such as the 2012° F. test just described, have been determined to be a more reliable indicator of oxidation resistance for alloys designed for service in aircraft gas turbine engines than static (constant temperature) oxidation tests. Generally, the results of cyclic oxidation tests cannot be correlated with the results of static oxidation tests. Data for weight loss per unit area for the alloys tested are given in Table III after as many as 250 cycles. The weight loss increased with increasing V and, from the data, somewhere between 3 and 3.5 a/o V appeared to be the critical level at which oxidation resistance was considerably affected. No great difference was noted between the Ta, Ti and Cb containing alloys at 3 a/oV.

Figure 2:
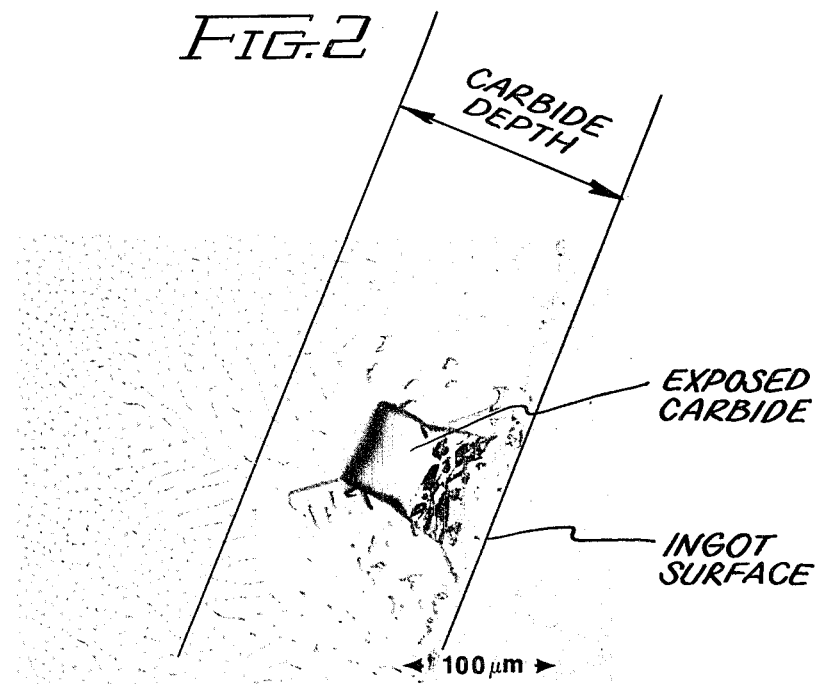
FIG. 2 is a photomicrograph at 250X of a cross-section taken perpendicular to the solidification direction of a unidirectionally solidified ingot of a monocarbide reinforced superalloy eutectic showing a surface nucleated carbide and illustrating the measurement of the depth of the carbide beneath the ingot surface.

Based on the results of the evaluation of the Table I alloys, the alloys of Table IV were prepared (except alloy 4253 which is relisted), directionally solidified, and processed for qualitative metallography and mechanical testing in a manner similar to that described above for the Table I alloys. For quantitative metallographic measurement of surface carbides, transverse sections were cut from the ⅞ inch (2.22 cm) diameter ingots, electroless plated, mounted and polished. Surface carbide severity is quantitatively reported herein in terms of the depth of the carbides beneath the ingot surface as measured on the transverse sections. Since any given transverse section may not cut through the exact center of a carbide, i.e., expose the full cross section of the carbide, the carbide depth was measured from the ingot surface to the point at which the structure appeared to be no longer perturbed due to the presence of the carbide, as shown in FIG. 2. In addition, alloys V3 and V4 were directionally solidified under the same conditions in a slab shape of 0.3 in.×1.5 in. (0.76 cm×3.81 cm) cross-section to provide mechanical test bars oriented transverse to the DS direction. Alloy compositions V2–V6 had 2, 3, 4, 5, and 6 atom percent vanadium, and held constant the atom percents of Ni, Co, Cr, Re, Al, C and B. For each vanadium content, the Mo, W, and Ta contents were adjusted to attempt to maintain a constant gamma prime and carbide volume fraction. Alloys EA and 4253 are alloys having columbium substituted for tantalum.

TABLE III

WEIGHT CHANGE FOR TABLE I ALLOYS IN 2012° F. CYCLIC OXIDATION TEST

| Alloy | a/oV | Weight Change (mg/cm²) after 250 h of cycling |
|---|---|---|
| 4142 | 0.00 | −3 |
| 4144 | 2.00 | −13 |
| 4147 | 3.00 | −17 |
| 4150 | 4.00 | −18 |
| 4154 | 6.00 | Removed from test at 142 h, severe loss |
| 4183 | 3.56 | −130 |
| 4184 | 2.67 | −44 |
| 4186 | 4.46 | −187 |
| 4187 | 5.24 | −262 |
| 4188 | 6.95 | Removed from test at 118 h, severe loss |
| 4190 | 3.51 | −106 |
| 4250 | 3.00 | −15 |
| 4253 | 3.00 | −5 |

TABLE IV

COMPOSITIONS OF DETAILED SURVEY ALLOYS[1,2]

| ALLOY | Co | Cr | Mo | W | Re | Al |
|---|---|---|---|---|---|---|
| | (atom percent) | | | | | |
| Ref. 1 | 4.2 | 5.1 | 2.1 | 1.6 | 2.3 | 12.9 |
| Ref. 2 | 4.1 | 4.6 | 0 | 1.0 | 2.2 | 12.2 |
| Ref. 3 | 3.7 | 2.2 | 0 | 0 | 2.0 | 14.2 |
| V2 | 4.2 | 5.1 | 1.4 | 1.1 | 2.3 | 12.9 |
| V3 | 4.2 | 5.1 | 1.1 | 0.8 | 2.3 | 12.9 |
| V4 | 4.2 | 5.1 | 0.8 | 0.6 | 2.3 | 12.9 |
| V5 | 4.2 | 5.1 | 0.4 | 0.3 | 2.3 | 12.9 |
| V6 | 4.2 | 5.1 | 0.1 | 0.1 | 2.3 | 12.9 |
| EA | 9.9 | 4.5 | 0.2 | 2.4 | 0 | 13.0 |
| 4253 | 3.0 | 6.0 | 0 | 1.0 | 1.8 | 13.0 |
| | (weight percent) | | | | | |
| Ref. 1 | 3.9 | 4.2 | 3.2 | 4.5 | 6.8 | 5.5 |
| Ref. 2 | 4.0 | 4.0 | 0 | 3.2 | 6.7 | 5.5 |
| Ref. 3 | 3.7 | 1.9 | 0 | 0 | 6.3 | 6.5 |
| V2 | 4.1 | 4.3 | 2.2 | 3.2 | 7.1 | 5.7 |
| V3 | 4.1 | 4.4 | 1.8 | 2.5 | 7.2 | 6.0 |
| V4 | 4.2 | 4.5 | 1.2 | 1.8 | 7.3 | 5.9 |
| V5 | 4.3 | 4.6 | 0.7 | 1.0 | 7.5 | 6.0 |
| V6 | 4.4 | 4.7 | 0.2 | 0.2 | 7.6 | 6.1 |
| EA | 10.4 | 4.1 | 0.4 | 7.9 | 0 | 6.2 |
| 4253 | 3.1 | 5.5 | 0 | 3.2 | 5.9 | 6.1 |

| ALLOY | V | Ta | C | B | Cb | R[3] |
|---|---|---|---|---|---|---|
| | (atom percent) | | | | | |
| Ref. 1 | 0 | 3.1 | 1.4 | 0.06 | 0 | — |
| Ref. 2 | 6.5 | 2.1 | 1.5 | 0 | 0 | — |
| Ref. 3 | 4.5 | 2.6 | 1.2 | 0 | 0 | — |
| V2 | 2.0 | 2.3 | 1.4 | 0.06 | 0 | — |
| V3 | 3.0 | 1.9 | 1.4 | 0.06 | 0 | — |
| V4 | 4.0 | 1.4 | 1.4 | 0.06 | 0 | — |
| V5 | 5.0 | 1.0 | 1.4 | 0.06 | 0 | — |
| V6 | 6.0 | 0.6 | 1.4 | 0.06 | 0 | — |
| EA | 3.0 | 0 | 2.2 | 0.06 | 1.1 | — |
| 4253 | 3.0 | 0 | 1.8 | 0.11 | 1.5 | — |
| | (weight percent) | | | | | |
| Ref. 1 | 0 | 9.0 | 0.27 | 0.01 | 0 | 0 |
| Ref. 2 | 5.6 | 6.3 | 0.29 | 0 | 0 | 0.89 |
| Ref. 3 | 3.9 | 8.0 | 0.24 | 0 | 0 | 0.49 |
| V2 | 1.7 | 6.8 | 0.28 | 0.01 | 0 | 0.25 |
| V3 | 2.6 | 5.6 | 0.28 | 0.01 | 0 | 0.46 |
| V4 | 3.5 | 4.4 | 0.29 | 0.01 | 0 | 0.80 |
| V5 | 4.4 | 3.2 | 0.29 | 0.01 | 0 | 1.38 |
| V6 | 5.4 | 1.9 | 0.30 | 0.01 | 0 | 2.84 |
| EA | 2.7 | 0 | 0.48 | 0.01 | 1.8 | 0.77 |

TABLE IV-continued

| COMPOSITIONS OF DETAILED SURVEY ALLOYS[1,2] | | | | | |
|---|---|---|---|---|---|
| 4253 | 2.7 | 0 | 0.38 | 0.02 | 2.4 | 0.58 |

[1]Balance nickel plus incidental impurities
[2]Melting Specification
[3]R = V/(Ta + 1.95 Cb), by weight Reference alloys 1 and 2 which are also presented in Table II are alloys within the range of alloys specified in U.S. Pat. Nos. 4,292,076 and 3,904,402, respectively. Reference alloy 3 is an experimental alloy previously found to be unacceptable for use in aircraft gas turbine engines due primarily to a lack of transverse ductility. Unless otherwise specified, further reference herein to the alloys of Table IV excludes the Reference 1, 2, and 3 alloys.

Details of the ingots of the Table IV alloys are given in Table V. With reference to Table V, the addition of vanadium appears to increase the amount of carbide in the alloy, since the sort-out changes from carbide to matrix at about 3 a/o V. For alloys V5 and V6, there was a region of matrix dendrites above the matrix sort-out in which aligned carbide whiskers and columnar matrix dendrites were both present.

The sixth column in Table V lists the fraction solidified from the top of the sort-out zone to the center of the gage of the longitudinal rupture specimens. Due to the matrix dendrites, the rupture bars for ingots V5 and V6 had to be machined from ingot sections of higher fraction solidified than those of the other alloys. For the alloys of Table I, as noted previously, the center of the gage section of the longitudinal rupture specimens corresponded to a fraction solidified value of 0.4 to 0.5.

Figure 3:
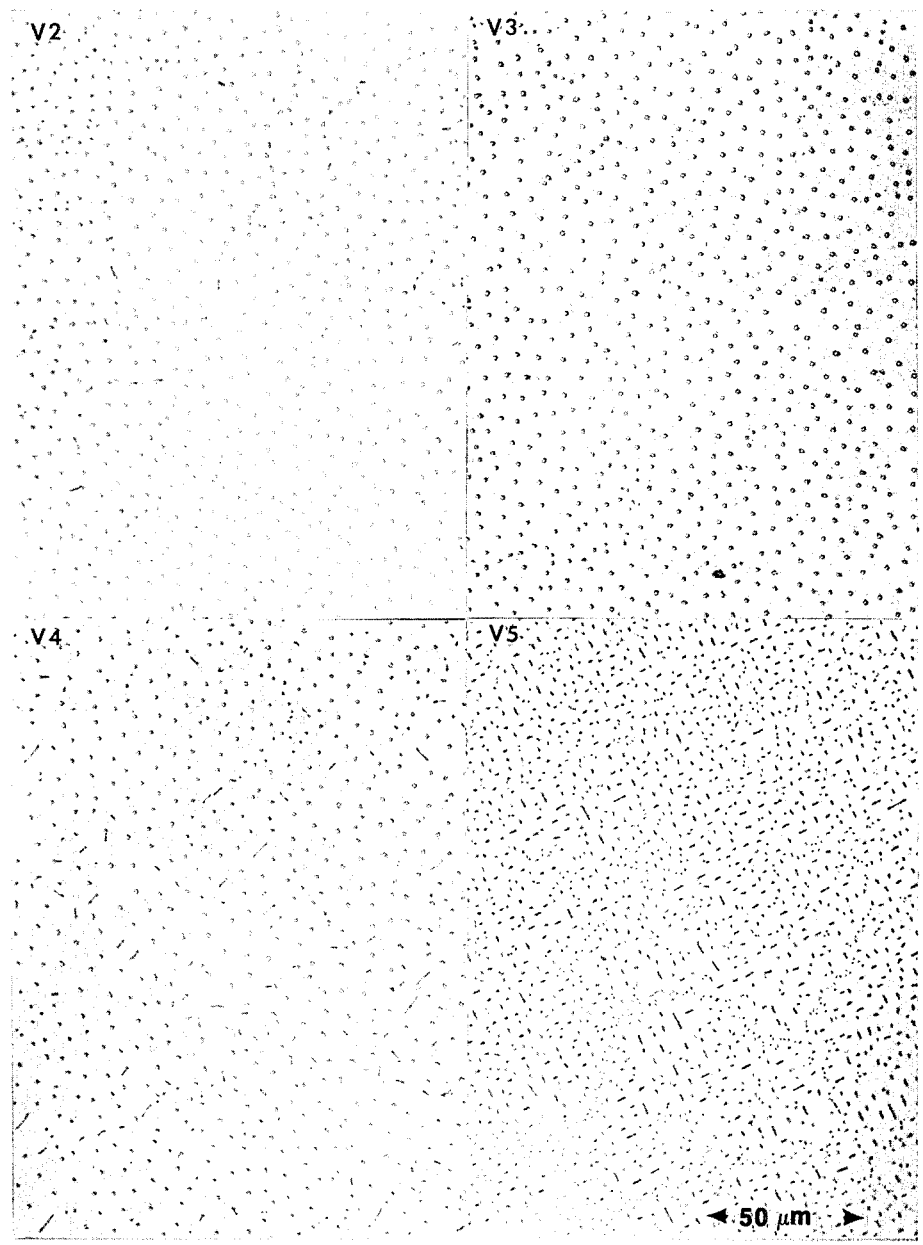
FIG. 3 is a series of four photomicrographs at 500X showing the microstructures of alloys V2 through V5 on sections transverse to the ingot solidification direction.

The solidified ingots of the alloys of Table IV had an aligned fibrous microstructure typical of monocarbide reinforced nickel-base superalloy eutectics. There were slight differences among the alloys which tended to correlate with increasing V content. For example, the number of blade-like carbide whiskers appeared to increase with increasing V content, from alloy V2, where there were few blades, to alloy V5 as shown in FIG. 3.

TABLE V

| DS INGOT DATA FOR THE ALLOYS OF TABLE IV | | | | | | | |
|---|---|---|---|---|---|---|---|
| | | | Sort Out | | | Carbide Fiber Density | |
| Alloy | D.S. No. | Shape Ingot | $g_{t'}$ | Type | $g_{gage}$ | $g_t$ | Fibers/in² × 10⁶ |
| V2 | 4173 | 7/8" bar | .02 | carbide | .29 | 0.50 | 13 |
| V3 | 4170 | 7/8" bar | .01 | carbide | .28 | 0.46 | 10 |
| V3 | 4181 | Slab | <.01 | carbide | — | — | — |
| V4 | 4281 | 7/8" bar | <.01 | matrix | .31 | 0.51 | 14 |
| V4 | 4175 | Slab | <.01 | matrix | .39 | — | — |
| V4 | 4177 | Slab | <.01 | matrix | — | — | — |
| V5 | 4174 | 7/8" bar | .07 | matrix | .38 | 0.52 | 22 |
| V6 | 4180 | 7/8" bar | .07 | matrix | .49 | 0.26 | 17 |
| 4253 | 4253 | 7/8" bar | — | — | — | — | — |
| EA | 4384 | 7/8" bar | .03 | carbide | .29 | — | — |

$g_{t'}$ = fraction of solidified ingot from top of chill to top of ingot occupied by the sort-out zone Alloy V6 had no blades and the fibers appeared to be in rows on the transverse sections, as if the microstructure were a broken lamellar one. The number of fibers per unit area also tended to increase with vanadium content as shown in Table V. The greater fiber population is consistent with the larger volume fraction of carbide evidenced from the increasing amount of matrix sort-out with increasing V content. For alloys V2-V6, the volume fraction of gamma prime was not measured directly, however, there appeared to be a trend of increasing gamma prime size with vanadium content.

Longitudinal stress rupture tests were made on alloys V2-V6 and EA at 1652° F./70 ksi (900° C./483 MPa), 1832° F./40 ksi (1000° C./276 MPa), and 2012° F./23.5 ksi (1100° C./162 MPa). Alloy 4253 was tested at 1652° F./70 ksi (900° C./483 MPa) and 2012° F./22.5 ksi (1100° C./155 MPa). Additionally, alloy V4 was tested at 2012° F./20 ksi (1100° C./138 MPa) and transverse (T) rupture tests were made on alloys V3 and V4. All rupture testing was performed in an argon atmosphere. Transverse tensile tests of alloys V2-V6 were performed in vacuo at a crosshead speed of 0.02 inches/min (0.05 cm/min).

Figure 4:
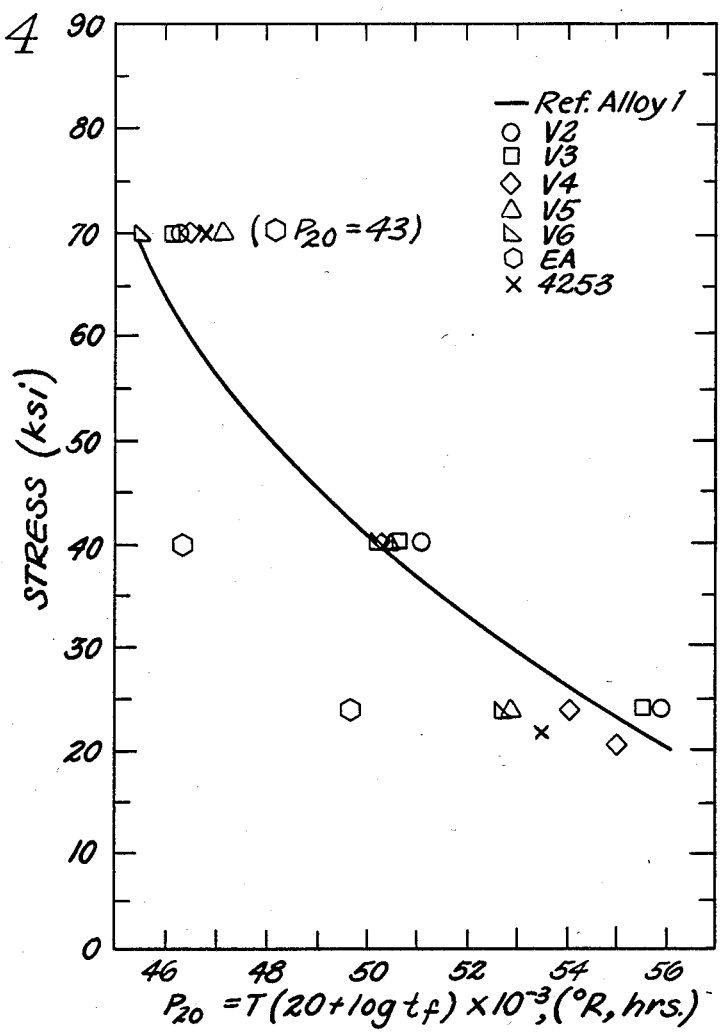
FIG. 4 is a graph of stress rupture properties whereon stress is plotted as a function of the Larson-Miller parameter.

The data from the rupture tests is listed in Table VI and graphed as a Larson-Miller plot in FIG. 4. The data from the transverse tensile tests is listed in Table VII. Vanadium was found to have a beneficial effect on rupture resistance at 70 ksi up to about 5 a/o V, but to have a detrimental effect on rupture resistance at this stress in amounts as large as 6 a/o. At 40 ksi, there is little effect of V content on rupture resistance. At 23.5 ksi, V has an initial beneficial effect on rupture resistance, alloys V2 and V3, and then an increasingly detrimental effect, alloys V4-V6. The transverse tensile strengths and ductilities of alloys V3 and V4 are comparable to the alloys of U.S. Pat. No. 4,292,076, thus it appears that V has no severely detrimental effect on transverse tensile properties.

TABLE VI

| STRESS RUPTURE STRENGTHS OF THE TABLE IV ALLOYS | | | | | |
|---|---|---|---|---|---|
| Alloy | Temp (F.) | Stress (ksi) | Life (hrs) | % El | % RA |
| V2 | 1652 | 70 | 85.98 | 10 | 18 |
| V2 | 1832 | 40 | 189.31 | 10 | 33 |
| V2 | 2012 | 23.5 | 434.80 | 7 | 7 |
| V3 | 1652 | 70 | 82.47 | 10 | 18 |
| V3 | 1832 | 40 | 132.66 | 7 | 23 |
| V3 | 2012 | 23.5 | 311.67 | 14 | 52 |
| V3T | 1652 | 43.5 | 136.22 | 3 | 4 |
| V4 | 1652 | 70 | 112.77 | 9 | 18 |
| V4 | 1832 | 40 | 99.80 | 11 | 27 |
| V4 | 2012 | 23.5 | 80.06 | 17 | 58 |
| V4 | 2012 | 20 | 201.36 | 16 | 57 |
| V4T | 1652 | 43.5 | 17.61 | 3 | 1 |
| V5 | 1652 | 70 | 229.36 | 16 | 25 |
| V5 | 1832 | 40 | 110.91 | 22 | 40 |
| V5 | 2012 | 23.5 | ~26 | 22 | 69 |
| V6 | 1652 | 70 | 32.86 | 4 | 3 |
| V6 | 1832 | 40 | 110.95 | 7 | 5 |
| V6 | 2012 | 23.5 | 21.97 | 18 | 43 |
| EA | 1652 | 70 | 4.84 | 21 | 32 |
| EA | 1832 | 40 | 2.36 | 28 | 43 |
| EA | 2012 | 23.5 | 1.31 | 29 | 93 |
| 4253 | 1652 | 70 | 142.0 | 16 | 25 |

TABLE VI-continued

STRESS RUPTURE STRENGTHS OF THE TABLE IV ALLOYS

| Alloy | Temp (F.) | Stress (ksi) | Life (hrs) | % El | % RA |
|---|---|---|---|---|---|
| 4253 | 2012 | 22.5 | 46.8 | 15 | 72 |

TABLE VII

TRANSVERSE TENSILE STRENGTHS OF THE TABLE IV ALLOYS

| Alloy | Temp (°F.) | 0.2% YS (ksi) | UTS (ksi) | % El | % RA |
|---|---|---|---|---|---|
| V3 | 1382 | 107 | 140 | 2.9 | 5.5 |
| V3 | 1652 | 125 | 128 | 3.6 | 7.4 |
| V3 | 1922 | 75 | 77 | 3.5 | 7.2 |
| V4 | 1382 | 111 | 136 | 2.7 | 9.3 |
| V4 | 1652 | 120 | 128 | 2.5 | 11.4 |
| V4 | 1922 | 71 | 74 | 4.3 | 5.1 |

Alloys EA and 4253, wherein columbium has been substituted for tantalum, are seen from FIG. 4 to be slightly weaker than tantalum bearing alloys V2–V6.

Figure 5:
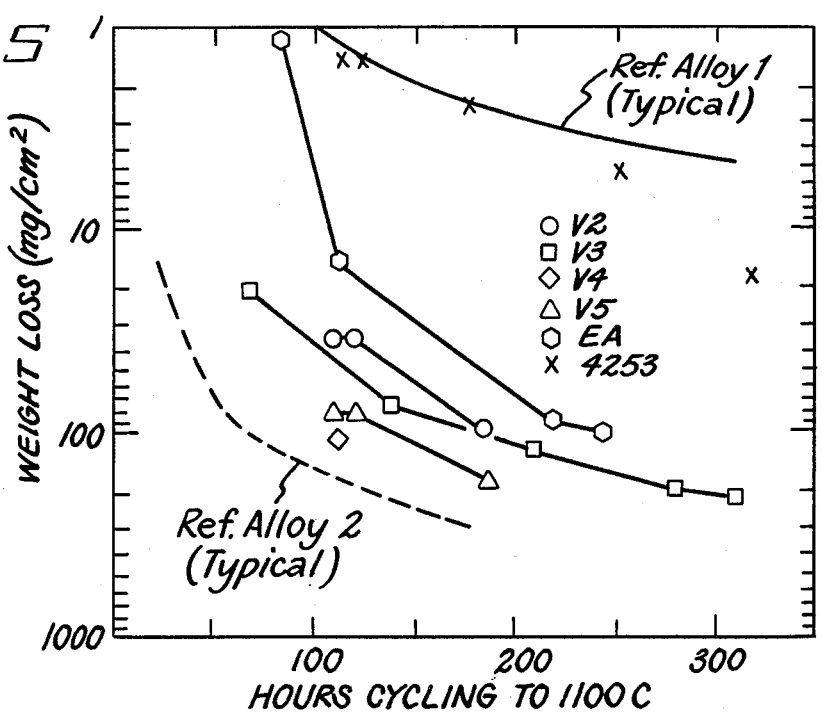
FIG. 5 is a semilogarithmic graph of cyclic oxidation properties whereon the weight loss is plotted as a linear function of hours of cycling to 1100° C.

Although superalloys of the type of Table IV which are designed for use in aircraft gas turbine engines are usually protected by specially designed environmental coatings, the uncoated alloys of Table IV were tested for cyclic oxidation resistance in the same manner as the alloys of Table I. The results of those tests are presented graphically as FIG. 5. As a class, the alloys of Table IV have poorer cyclic oxidation resistance than uncoated alloys typical of the U.S. Pat. No. 4,292,076 patent (Ref. alloy 1), but better cyclic oxidation resistance than uncoated alloys typical of the U.S. Pat. No. 3,904,402 patent (Ref. alloy 2).

Figure 6:
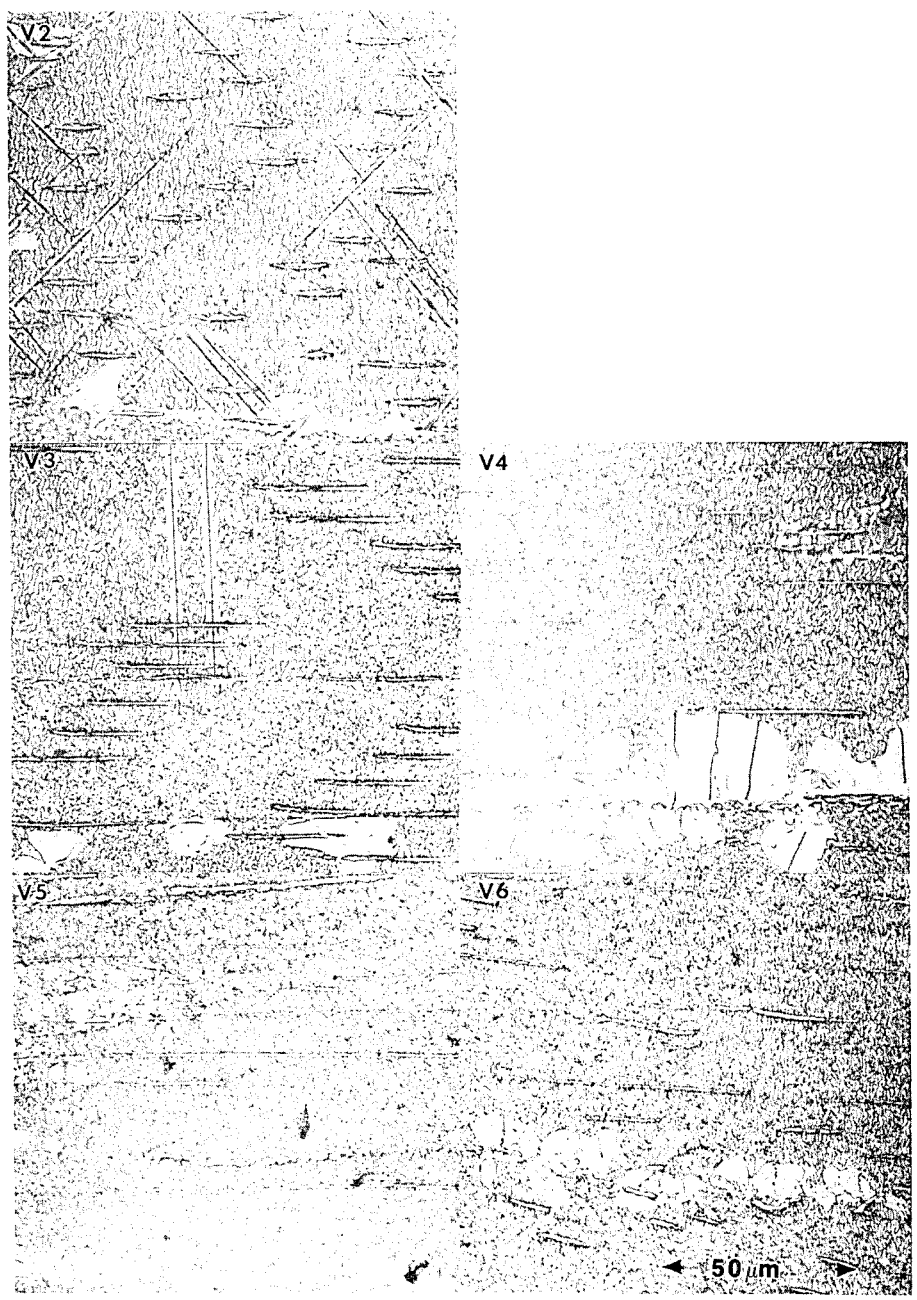
FIG. 6 is a series of photomicrographs at 625X of longitudinal sections from the gage sections of 1100° C. rupture bars for alloys V2 (23.5 ksi, 435 hrs), V3 (23.5 ksi, 312 hrs), V4 (20 ksi, 201 hrs), V5 (23.5 ksi, 26 hrs) and V6 (23.5 ksi, 22 hrs)

The failed 2012 F. rupture specimens of alloys V2–V6 were examined for microstructural phase instabilities. FIG. 6 shows typical photomicrographs. Alloy V2 has heavy plate precipitates typical of the $M_6C$ instability known to occur in the alloys of U.S. Pat. Nos. 4,284,430 and 4,292,076. Alloy V3 has a few instances of this plate precipitate. For alloys V4, V5 and V6, some grain boundary precipitates were observed, but no plates. In alloys V4, V5, and V6 most grain boundaries were fairly precipitate-free, and FIG. 6 shows the most extreme examples of instability seen in each alloy. The rupture lives of V5 and V6 were short, thus it cannot be concluded that these alloys are phase stable since their exposure time was considerably less than the other alloys.

Figure 7:
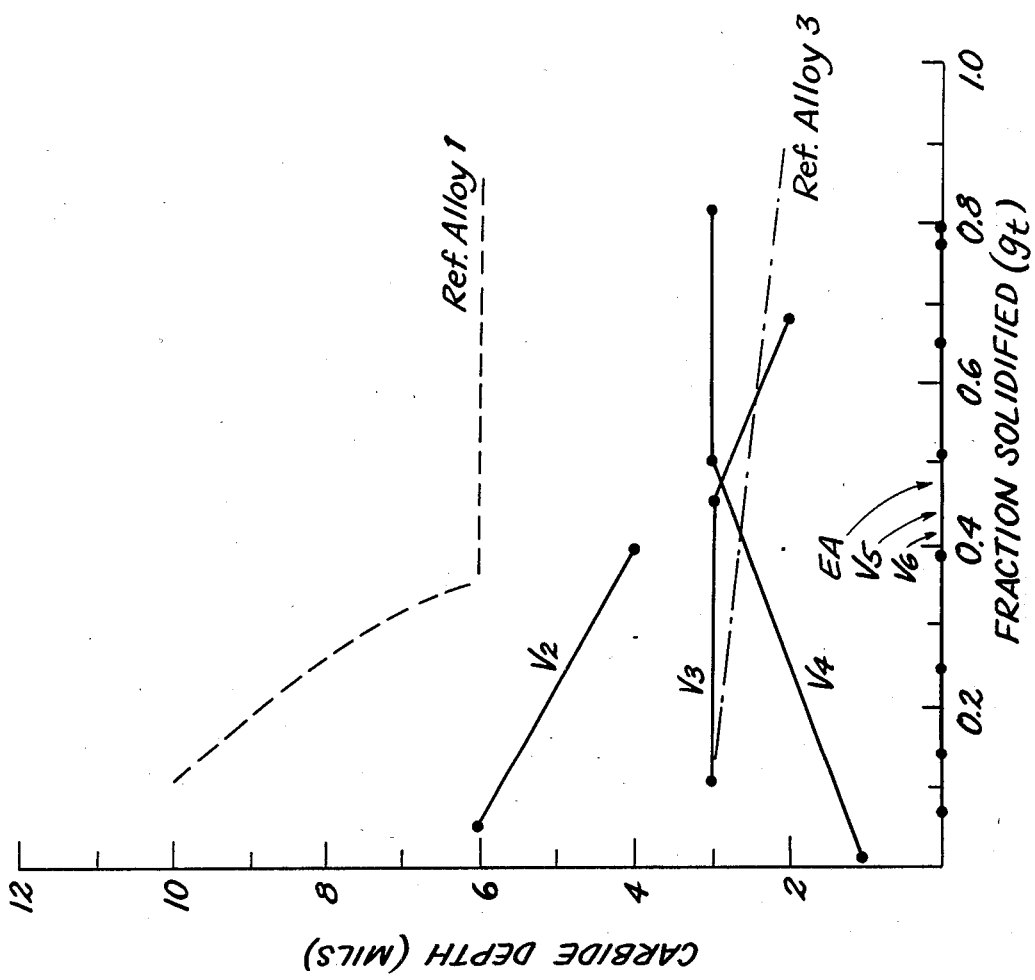
FIG. 7 is a graph of surface carbide severity whereon the depth of the carbide is plotted as a function of the fraction solidified.

The severity of surface carbides for the alloys of Table IV was characterized by the depth of the largest surface carbide on three transverse sections taken from each $\frac{7}{8}''$ diameter ingot as described above with reference to FIG. 2. These measurements are listed in Table VIII and shown on FIG. 7. FIG. 7 also shows previously-obtained data for the alloys of U.S. Pat. No. 4,294,076 and Reference alloy 3.

Figure 8:
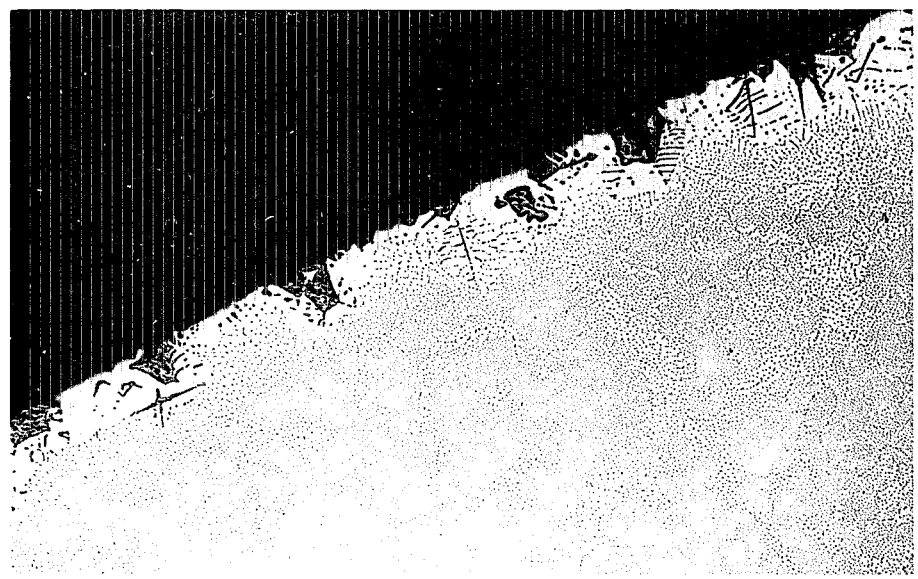
FIG. 8 is a photomicrograph at 100X illustrating, on a section cut transverse to the solidification direction, the substantially continuous ring of surface nucleated carbides typically found in Reference alloy 1.

Table VIII and FIG. 7 show that vanadium has a strong beneficial effect on reducing the size of surface carbides. Alloys V5 and V6 had no surface carbides at all on the polished sections, and alloy V3 and V4 had about ten surface carbides on a polished $\frac{7}{8}$ in. (2.22 cm) diameter ingot section. In contrast, the alloys of U.S. Pat. Nos. 4,284,430 and 4,292,076 commonly exhibit essentially a shell of continuous surface carbides about the circumference of polished transverse sections as is shown in the representative photomicrograph of FIG. 8.

Alloys V3 and V4 have surface carbide severities about equivalent to Reference alloy 3 and alloys V5 and V6 have substantially no surface carbides; characteristics similar to the alloys of U.S. Pat. No. 3,904,402. Thus, it has been discovered that the severity of surface carbides in superalloys such as those similar to those of U.S. Pat. No. 4,294,076, and those of the same type having columbium substituted for tantalum, ranks with the ratio of vanadium to tantalum and/or columbium, rather than with the absolute V content. On an atom basis then, it has been discovered that the ratio (V/Ta+Cb) should be equal to or greater than at least about 0.8 in order to render the superalloys substantially free of surface nucleated carbides. This discovery can be specified in terms of weight percentages by dividing vanadium, tantalum and columbium by their respective atomic weights and clearing fractions to yield the criterion, that, by weight, the ratio of [V/(Ta+1.95Cb)] should be equal to or greater than about 0.23.

TABLE VIII

SURFACE CARBIDE SIZES OF THE ALLOYS OF TABLE IV

| Alloy | Ingot | $g_t$ | Depth (mils) |
|---|---|---|---|
| V2 | DS4173 | .05 | 6 |
| V2 | DS4173 | .50 | 4 |
| V3 | DS4170 | .11 | 3 |
| V3 | DS4170 | .46 | 3 |
| V3 | DS4170 | .69 | 2 |
| V4 | DS4281 | .01 | 1 |
| V4 | DS4281 | .51 | 3 |
| V4 | DS4281 | .82 | 3 |
| V5 | DS4174 | .15 | 0 |
| V5 | DS4174 | .52 | 0 |
| V5 | DS4174 | .80 | 0 |
| V6 | DS4180 | .07 | 0 |
| V6 | DS4180 | .26 | 0 |
| V6 | DS4180 | .66 | 0 |
| EA | DS4384 | .08 | 0 |
| EA | DS4384 | .39 | 0 |
| EA | DS4384 | .77 | 0 |

Using the above newly discovered knowledge, it is now possible to specify new superalloy compositions which are particularly characterized as having improved resistance to the formation of surface nucleated carbides and are capable of developing in a unidirectionally solidified anisotropic article of manufacture a microstructrue comprising a nickel-base superalloy matrix with an aligned fibrous monocarbide eutectic reinforcing phase embedded in the matrix. Broadly, these new superalloys consist essentially of vanadium and carbon; one or more elements selected from the group consisting of chromium, aluminum, cobalt, tungsten, molybdenum, hafnium, and zirconium; boron in an amount greater than an impurity amount up to 0.02%, and at least one element from the group consisting of tantalum and columbium such that, by weight:

$$V/(Ta+1.95Cb) \geq \text{about } 0.23, \quad (1)$$

the balance being essentially nickel and incidental impurities.

More specifically, the aforesaid novel superalloys consist essentially of, by weight, 0–20% cobalt, 0–20% chromium, 0–10% molybdenum, 0–20% tungsten, 0–9% rhenium, 0–10% aluminum, 0.7–7% vanadium, 0–15% tantalum, 0.1–1% carbon, 0 to less than 0.8% titanium, 0–4% columbium, 0–3% hafnium, 0–1.5% zirconium, boron in an amount greater than an impurity amount to 0.02%, the balance being essentially nickel and incidental impurities, subject to the proviso that, on a weight basis:

$$V/(Ta+1.95Cb) \geq about\ 0.23,$$

wherein either Ta or Cb, but not both, may be essentially zero.

Yet more specifically, the aforesaid novel superalloys consist essentially of about, by weight, 3.9–4.4% cobalt, 4.1–4.7% chromium, 1.0–2.4% molybdenum, 1.6–3.4% tungsten, 6.0–7.1% rhenium, 5.0–6.2% aluminum, 1.5–3.7% vanadium, 4.2–7.0% tantalum, 0.25–0.31% carbon, 0.001–0.02% boron, the balance being essentially nickel and incidental impurities.

A further embodiment of the aforesaid novel superalloys wherein columbium is substituted for tantalum consists essentially of about, by weight, 3.0–12% cobalt, 3.5–6.0% chromium, 0–1.5% molybdenum, 0–9.0% tungsten, 0–7.0% rhenium, 5.0–6.5% aluminum, 1.5–3.0% columbium, 0.8–3.0% vanadium, 0.15–0.5% carbon, 0.001–0.02% boron, the balance being essentially nickel and incidental impurities.

The nickel-base superalloy matrix of the unidirectionally solidified anisotropic articles of manufacture of the invention comprise a solid solution gamma phase and an ordered equiaxed precipitate-strengthening gamma-prime phase. The aligned monocarbide phase is of the $M_1C_1$ type having a NaCl type crystal structure wherein the M atoms are located at the face centered cubic lattice sites, the carbon (C) atoms occupy the octahedral interstitial sites, and M is a metal selected from the group consisting essentially of titanium, vanadium, columbium, hafnium, zirconium and tantalum and their alloys and mixtures, e.g., $[Ta_{0.6}V_{0.4}]C$. Additionally, there may be present (soluble) in the carbide one or more elements which are also present in the nickel-base superalloy matrix.

Specifically contemplated as articles of manufacture of the invention, although the invention is not so limited, are vanes and rotating blades for aircraft gas turbine engines. The novel monocarbide reinforced eutectic superalloys of the invention are additionally characterized as having the hot corrosion resistance, cyclic oxidation resistance and high temperature strength properties, including transverse ductility, required of such vanes and blades in aircraft gas turbine engine applications.

As used herein, "0.2%YS" means the yield strength at 0.2% offset, "UTS" means ultimate tensile strength, "ksi" means thousands of pounds per square inch, "MPa" means megapascals, "El" means elongation at failure and "RA" means reduction in area at failure. Also, the term "boron in an amount greater than an impurity amount" means at least 0.001% boron by weight.

What is claimed is:

1. A unidirectionally solidified anisotropic composite article of manufacture being essentially free of surface nucleated carbides comprising:
    (a) a nickel-base superalloy matrix and
    (b) an aligned fibrous monocarbide eutectic reinforcing phase embedded in said matrix, said article consisting essentially of vanadium and carbon; one or more elements selected from the group consisting of chromium, aluminum, cobalt, tungsten, molybdenum, hafnium, and zirconium; boron in an amount greater than an impurity amount up to 0.02%; and at least one element from the group consisting of tantalum and columbium such that, by weight, $$V/(Ta+1.95Cb) \geq about\ 0.23,$$

the balance being essentially nickel and incidental impurities.

2. A unidirectionally solidified anisotropic composite metallic article of manufacture being substantially free of surface nucleated carbides comprising:
    (a) a nickel-base superalloy matrix, and
    (b) an aligned fibrous monocarbide eutectic reinforcing phase embedded in said matrix, said article consisting essentially of, by weight, 0–20% cobalt, 0–20% chromium, 0–10% molybdenum, 0–20% tungsten, 0–9% rhenium, 0–10% aluminum, 0.7–7% vanadium, 0–15% tantalum, 0.1–1% carbon, 0 to less than 0.8% titanium, 0–4% columbium, 0–3% hafnium, 0–1.5% zirconium, boron in an amount greater than an impurity amount to 0.02%, the balance being essentially nickel and incidental impurities, subject to the proviso that, on a weight basis:

$$V/(Ta+1.95Cb) \geq about\ 0.23.$$

3. The claim 2 article consisting essentially of about, by weight, 3.9–4.4% cobalt, 4.1–4.7% chromium, 1.0–2.4% molybdenum, 1.6–3.4% tungsten, 6.0–7.1% rhenium, 5.0–6.2% aluminum, 1.5–3.7% vanadium, 4.2–7.0% tantalum, 0.25–0.31% carbon, 0.001–0.02% boron, the balance being essentially nickel and incidental impurities.

4. The claim 2 article consisting essentially of about, by weight, 3.0–12% cobalt, 3.5–6.0% chromium, 0–1.5% molybdenum, 0–9.0% tungsten, 0–7.0% rhenium, 5.0–6.5% aluminum, 1.5–3.0% columbium, 0.8–3.0% vanadium, 0.15–0.5% carbon, 0.001–0.02% boron, the balance being essentially nickel and incidental impurities.

* * * * *